United States Patent
Shapiro et al.

(10) Patent No.: US 11,764,768 B2
(45) Date of Patent: Sep. 19, 2023

(54) DYNAMIC SLEW RATE CONTROLLER

(71) Applicant: VISIC TECHNOLOGIES LTD., Nes Ziona (IL)

(72) Inventors: David Shapiro, Rishion LeZion (IL); Shmuel Ben-Yaacov, Tel Yitzhak (IL)

(73) Assignee: Visic Technologies Ltd., Nes Ziona (IL)

( * ) Notice: Subject to any disclaimer, the term of this patent is extended or adjusted under 35 U.S.C. 154(b) by 0 days.

(21) Appl. No.: 17/530,463

(22) Filed: Nov. 19, 2021

(65) Prior Publication Data
US 2022/0158629 A1    May 19, 2022

(30) Foreign Application Priority Data
Nov. 19, 2020 (IL) ........................... 278835

(51) Int. Cl.
| | | |
|---|---|---|
| *H03K 5/00* | (2006.01) | |
| *H03K 5/12* | (2006.01) | |
| *H03K 3/037* | (2006.01) | |
| *H03K 5/13* | (2014.01) | |
| *H02P 27/08* | (2006.01) | |

(52) U.S. Cl.
CPC ............ *H03K 5/12* (2013.01); *H03K 3/0377* (2013.01); *H03K 5/13* (2013.01); *H02P 27/08* (2013.01)

(58) Field of Classification Search
CPC ........... H03K 5/12; H03K 3/0377; H03K 5/13
See application file for complete search history.

(56) References Cited

U.S. PATENT DOCUMENTS

| | | | | |
|---|---|---|---|---|
| 6,979,985 | B2 * | 12/2005 | Yoshida ............... | H02M 3/1588 |
| | | | | 323/282 |
| 7,576,527 | B1 * | 8/2009 | Zhang ................. | H02M 3/1563 |
| | | | | 323/284 |
| 7,714,562 | B2 * | 5/2010 | Oswald ............... | H02M 3/1563 |
| | | | | 323/284 |
| 8,228,698 | B2 | 7/2012 | Sarén et al. | |
| 9,929,651 | B2 * | 3/2018 | Cannankurichi | ..... H02M 3/158 |
| 10,270,330 | B2 * | 4/2019 | Engelhardt | ........... H02M 3/157 |
| 2002/0125869 | A1 | 9/2002 | Groom et al. | |
| 2011/0187341 | A1 | 8/2011 | Chu et al. | |

(Continued)

FOREIGN PATENT DOCUMENTS

| | | |
|---|---|---|
| CN | 103947092 | 7/2014 |
| EP | 0617501 | 9/1994 |
| JP | 2006311074 | 11/2006 |

OTHER PUBLICATIONS

Juha-Pekka Strom, et. al., "Active Du/DT filtering for variable-speed AC drives", Dec. 17, 2009; 127 pgs; Dissertation, Acta Universitatis Lappeenrantaensis 378, Lappeenranta University of Technology, Finland.

(Continued)

*Primary Examiner* — Tuan T Lam
(74) *Attorney, Agent, or Firm* — A. C. Entis-IP Ltd.; Allan C. Entis (57) ABSTRACT

A voltage pulse generator comprising: circuitry controllable to generate a voltage pulse at an output of the circuitry; and an interruptor that monitors voltage at the output during a transition edge of the voltage pulse and interrupts a voltage change associated with the transition edge if the monitored voltage differs from a predetermined reference voltage by a predetermined amount.

16 Claims, 4 Drawing Sheets

(56) References Cited

U.S. PATENT DOCUMENTS

| | | | |
|---|---|---|---|
| 2012/0161728 A1 | 6/2012 | Chen et al. | |
| 2012/0229105 A1 | 9/2012 | Hayes et al. | |
| 2013/0106385 A1* | 5/2013 | Smith, Jr. | H02M 3/1588 323/288 |
| 2015/0381037 A1* | 12/2015 | Romeo | H02M 3/156 323/282 |
| 2017/0070148 A1* | 3/2017 | Yuan | H02M 1/12 |
| 2017/0141685 A1* | 5/2017 | Cannankurichi | H02M 3/1563 |
| 2018/0226878 A1* | 8/2018 | Shao | H02M 3/158 |

OTHER PUBLICATIONS

J. Korhonen, et. al. "Control of an Inverter output active du/dt filtering method", 2009; 35th Annual Conference of IEEE Industrial Electronics Porto, pp. 316-321.

R. Mini, et. al., "Active LC Clamp dv/dt Filter for Voltage Reflection due to Long Cable in Induction Motor Drives", International Journal of Electrical and Computer Engineering (IJECE); vol. 6, No. 4, Aug. 2016, pp. 1456-1469.

F. Maislinger, et al., "Design of a 100 kHz wide bandgap inverter for motor applications with active damped sine wave filter", The 9th International Conference on Power Electronics, Machines and Drives (PEMD 2018), electronic version published Apr. 16, 2019; J. Eng. vol. 2019 Iss. 17, pp. 3766-3771.

T. Fuchslueger, et. al., "Reducing dv/dt of Motor Inverters by Staggered-Edge Switching of Multiple Parallel SiC Half-Bridge Cells" PCIM Europe 2017: International Exhibition and Conference for Power Electronics, Intelligent Motion, Renewable Energy and Energy Management, Nuremberg, Germany, Jun. 2017, pp. 1-8.

Israeli Office Action dated Apr. 28, 2021 for Application No. 278835 filed Nov. 19, 2020.

Extended European Search Report dated Apr. 4, 2022 for Application No. 21209249.8 filed Nov. 19, 2021.

Chinese Office Action dated Aug. 3, 2022 in corresponding Chinese Patent application No. 2021113720034 filed Nov. 19, 2021.

Korean Office Action dated Jan. 18, 2023 in corresponding Korean Patent application No. 10-2021-0155733 filed Nov. 12, 2021.

Chinese Office Action dated Jan. 20, 2023 in corresponding Chinese Patent application No. 2021113720034 filed Nov. 19, 2021.

* cited by examiner

DYNAMIC SLEW RATE CONTROLLER

RELATED APPLICATIONS

The present application claims the benefit under 35 U.S.C. § 119(a)-(d) of Israeli Application 278835 filed on Nov. 19, 2020, the disclosure of which is incorporated herein by reference

FIELD

Embodiments of the invention relate to controlling a slew rate of a pulse generator.

BACKGROUND

Modern optical and electronic devices of almost all types, from computers to powertrains, comprise pulse forming circuitry for generating timing pulses, data packets, and/or delivering power. Features of the pulses that the various pulse forming circuitries generate determine how well the pulses function in the applications for which they are generated.

For example modern electric powertrain that drives a vehicle comprises an electric motor and a DC power source from which the power train delivers energy to the motor to drive the vehicle. The powertrain comprises a voltage source inverter (VSI) that converts a DC voltage provided by the power source to pulses of voltage that the VSI applies to the motor to energize the motor coils and provide the motor with energy to drive the vehicle. The VSI may be configured in accordance with any of various schemes to control voltage pulse frequency, width, and/or magnitude that the VSI provides to control motor torque and/or speed.

For electric vehicle powertrains comprising a three-phase induction motor the VSI typically converts the power source DC voltage to provide each phase of the motor with a train of relatively high voltage pulses having same voltage but modulated pulse widths. The pulse widths are typically modulated in accordance with a pulse width modulation (PWM) scheme so that power delivered to a given phase approaches that which would be provided by a sinusoidally varying voltage provided by a three phase AC power supply. The PWM scheme is usually implemented using a sinusoidal pulse width modulation (SPWM) or space vector control (SVC) technique.

Generally, a fast switching half bridge configuration of semiconductor power switches that are controlled to rapidly switch an output of the half bridge between an ON state and an OFF state produces the voltage pulses. In the ON state the output of the half bridge connects the given phase to a busbar carrying the DC voltage of the power source and in the OFF state the output of the half bridge connects the given phase to a ground reference of the DC power source. Typically, the pulses generated by the half bridge are characterized by relatively high slew rate rise and fall times, repetition frequencies between about 5-10 kHz (kilohertz), and voltages that may have a value between about 200 V (volts) and about 500 V. Transients generated by the high slew rate, high voltage pulses could generate harmful electromagnetic interference (EMI) and may be damaging to the coils that carry the phase current and different techniques are often used to limit the slew rates of the pulses that reach the coils from the half bridge. The pulse trains for the different phases of the three-phase motor are shifted relative to each other by ±120°.

SUMMARY

An aspect of an embodiment of the disclosure relates to providing a voltage pulse generator (VPG) that dynamically controls in real time a rise and/or fall time voltage of a voltage pulse that the VPG produces at an output of the VPG to provide the pulse with a desired average rise and/or fall time voltage slew rate.

In an embodiment the VPG comprises a controller that generates ON and OFF signals which operate to turn ON and turn OFF voltage provided to the output of the VPG to produce voltage pulses that the VPG provides to a load connected to the output. The VPG comprises a negative feedback circuit, hereinafter also referred to as an "interruptor circuit" or simply "interruptor", comprising circuitry that provides the interruptor with a time dependent reference voltage having a desired rise time and/or fall time voltage slew rate. During the rise time and/or fall time of a voltage pulse that the VPG generates, the interruptor compares voltage at the VPG output to the rise time and/or fall time reference voltage respectively. For a positive pulse at the VPG output, if the output voltage is greater than the reference voltage by a predetermined upper limit amount and the VPG is ON, the interruptor turns OFF voltage provide to the VPG output. If the output voltage is less than the reference voltage by a predetermined lower limit amount and the VPG is OFF, the interruptor turns ON voltage provided to the VPG. For a negative pulse at the VPG output, if the reference voltage is greater than the output voltage by a predetermined upper limit amount and the VPG is ON, the interruptor turns OFF voltage provided to the VPG output. If the reference voltage is less than the output voltage by a predetermined lower limit amount and the VPG is OFF, the interruptor turns ON voltage provided to the VPG output. By turning ON and turning OFF the VPG as described, the interruptor operates to provide the VPG with a desired average slew rate for leading and/or falling edges of the voltage pulse. The VPG is understood to be turned ON and turned OFF when voltage provided to the VPG output is respectively turned ON and turned OFF.

In an embodiment, the VPG comprises a switch mode converter configured to provide DC power to a load by turning ON and turning OFF the output of the VPG responsive to a pulse train, optionally generated in accordance with PWM scheme. In an embodiment, the VPG comprises a switch mode inverter configured to provide AC power to a load by turning ON and turning OFF the output of the VPG.

In an embodiment, the VPG comprises a voltage source inverter, VSI, configured to provide power to a three-phase motor and comprises an output for each phase. The VSI provides a substantially identical train of voltage pulses at each output with each pulse train phase shifted by ±120° from each of the other pulse trains. Optionally, the voltage pulse trains are SPWM or SVC pulse trains.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter

BRIEF DESCRIPTION OF THE FIGURES

Non-limiting examples of embodiments of the invention are described below with reference to figures attached hereto that are listed following this paragraph. Identical structures, elements or parts that appear in more than one figure are generally labeled with a same numeral in all the figures in which they appear. Dimensions of components and features shown in the figures are chosen for convenience and clarity of presentation and are not necessarily shown to scale.

DETAILED DESCRIPTION

Figure 1:
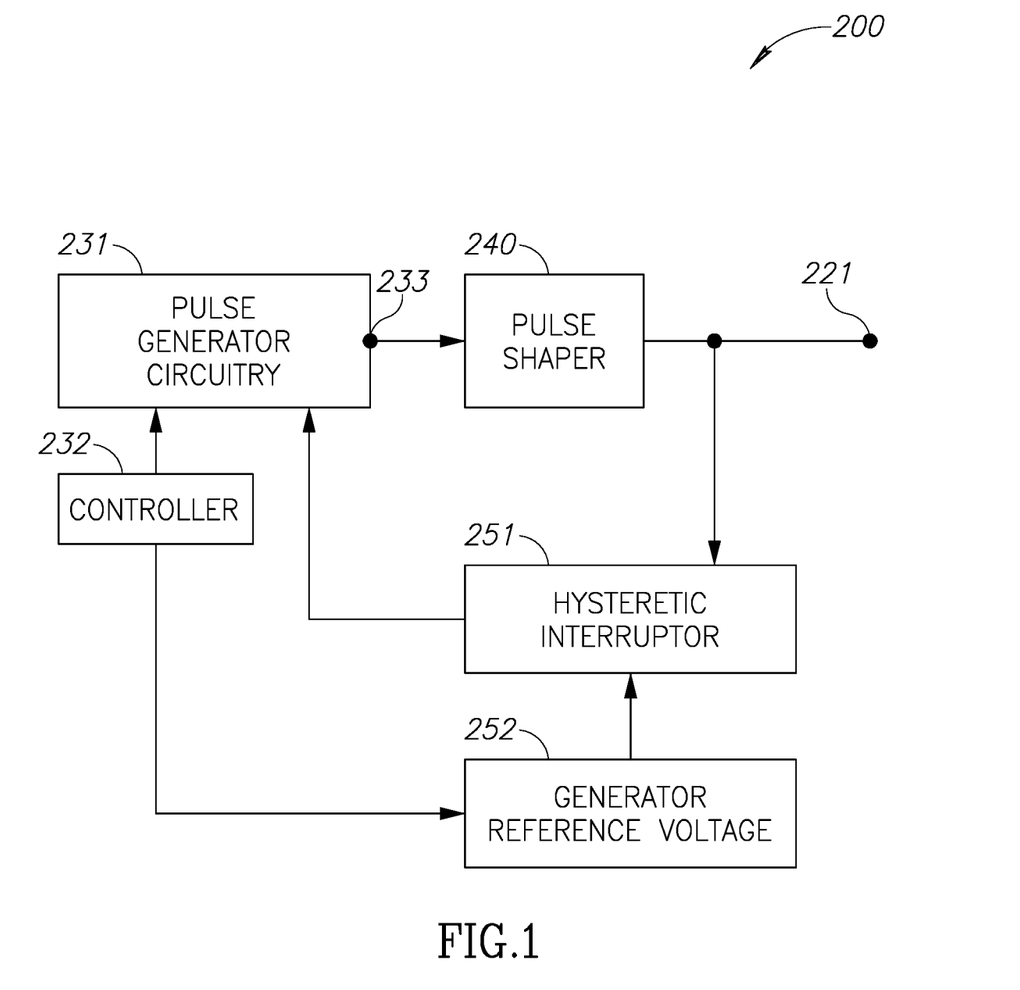
FIG. 1 shows a schematic of a voltage pulse generator, VPG, comprising an interruptor to limit slew rates of pulses that the VPG provides, in accordance with an embodiment of the disclosure.
Figure 2A:
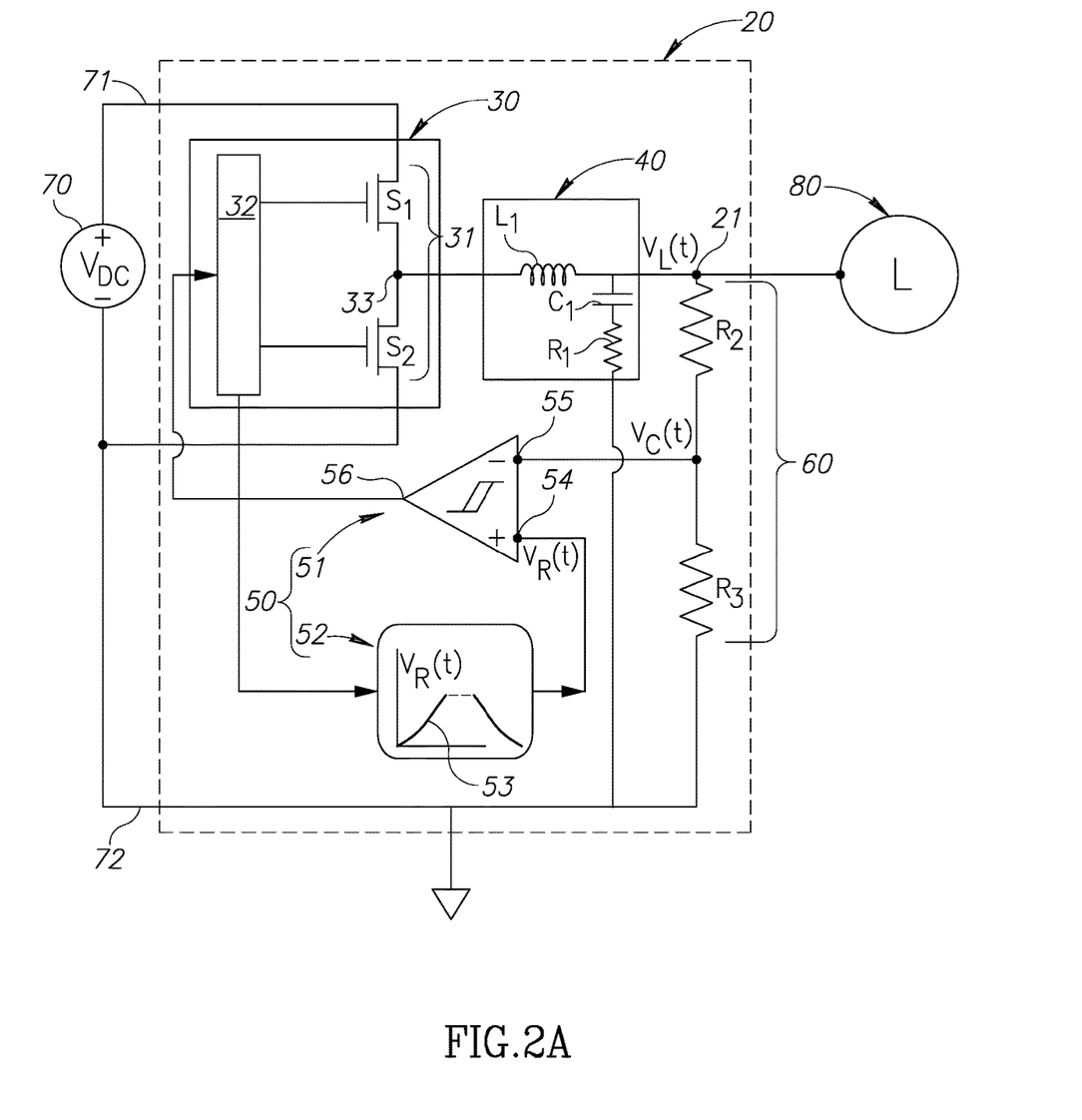
FIG. 2A shows a schematic of a VSI in accordance with an embodiment of the disclosure.

In the following detailed description components of a VPG in accordance with an embodiment of the disclosure are schematically shown in FIG. 1 and discussed with reference to the figure. A VPG configured as a VSI in accordance with an embodiment of the disclosure is described with reference to a schematic circuit shown in FIG. 2A. Monitoring and controlling voltage of leading and trailing edges of a voltage pulse to moderate average slew rates of the leading and trailing edges in accordance with an embodiment of the disclosure as implemented optionally by the VSI shown in FIG. 2A is discussed with reference to simulated oscilloscope pulse traces shown in FIG. 2B. A VSI based on the VSI shown in FIG. 2A for providing voltage to an electric induction motor is discussed with reference to FIG. 3.

FIG. 1 schematically shows a VPG 200, in accordance with an embodiment of the disclosure. VPG 200 comprises pulse generator circuitry 231 and a controller 232 that controls the pulse generator circuitry to generate voltage pulses at an output 233 of the pulse generator circuitry. The pulses are received and filtered by a low pass pulse shaper 240. The pulse shaper shapes the pulses and provides the shaped pulses to a load (not shown) at an output 221 of the VPG. A hysteretic comparator circuit, also referred to as a hysteretic interruptor 251, taps output 221 to monitor voltage at the output. The interruptor is connected to a reference voltage generator 252. In response to VPG 200 operating to produce a voltage pulse at output 221, reference voltage generator 252 provides interruptor 251 with a time dependent reference voltage. The reference voltage has leading and trailing edges that are characterized by desired slew rates and are synchronized with leading and trailing edges respectively of the output voltage pulse at output 221. Optionally, as schematically shown in FIG. 1 the reference voltage generator is connected to controller 232 and synchronizes the reference voltage to the output pulse voltage responsive to signals generated by the controller. Alternatively or additionally, controller 232 and reference voltage generator 252 optionally receive synchronization signals from an outside source and the reference voltage generator uses the synchronization signal that it receives from the outside source to synchronize the reference voltage to the output voltage pulse.

During the rise time of the leading edge of the output voltage pulse, interruptor 251 compares the voltage at output 221 with the voltage of the leading edge of the reference voltage. If at a given time during the rise time of the output voltage pulse the magnitude of the monitored output voltage or a function thereof, is greater by a predetermined upper limit voltage difference, hereinafter also referred to as an upper hysteresis value, than the magnitude of the reference voltage, the interruptor transmits a signal that causes pulse generator circuitry 231 to interrupt increase of voltage at output 221 and allow the output voltage to decay. The signal may by way of example be a signal transmitted to controller 232 or pulse generator circuitry 231. In an embodiment the interruption lasts until a time at which the monitored voltage decreases to equal a voltage that is less than the magnitude of the reference voltage by a predetermined lower limit voltage difference, which difference may be referred to as a lower hysteresis value. At such a time, the interrupter transmits a signal that causes pulse generator circuitry 231, to interrupt the decrease and resume operation to increase the voltage at the output. Times at which interruptor 251 interrupts increase or decrease of voltage during a rise time of a voltage pulse at output 221 may be referred to as rise time increase and decrease turnabout times, respectively.

Similarly, during the fall time of the trailing edge of the output voltage pulse interruptor 251 compares the monitored voltage at output 221 or a function thereof with the voltage of the trailing edge of the reference voltage. If at a given time during the fall time of the output pulse, the magnitude of the monitored output voltage or function thereof is less than the magnitude of the reference voltage by a lower hysteresis value, the interruptor generates a signal that causes pulse generator circuitry 231 to interrupt decrease of voltage at output 221 and operate to increase voltage at the output. By way of example the signal may be a signal transmitted to controller 232 or pulse generator circuitry 231 that causes the interruption. In an embodiment the interruption lasts until such time that the monitored voltage or function thereof increases to equal a voltage that is greater than the magnitude of the reference voltage by an upper hysteresis value. At such a time the interrupter generates a signal that causes pulse generator circuitry 231 to interrupt the increase and allow the output voltage to resume decreasing. Times at which interruptor 251 interrupts decrease or increase of voltage during a fall time of a voltage pulse at output 221 may be referred to as fall time decrease and increase turnabout times, respectively.

Optionally, hysteretic interruptor 251 comprises a Schmitt trigger that compares a fraction less than one of the monitored output voltage at output 221 with the reference voltage to determine rise and fall time turnabout times. The hysteresis values by which the monitored output voltage differs from the reference voltage may be determined by switching thresholds of the Schmitt trigger.

FIG. 2A schematically shows a VGA configured as a VSI circuit 20 coupled to a DC voltage source 70 and to a load 80, that is optionally a phase of a motor, in accordance with an embodiment of the disclosure. Voltage source 70 generates a DC voltage $V_{DC}$ on a busbar 71 relative to a reference ground 72. VSI 20 provides load 80 with voltage pulses (not shown in FIG. 2A) generated from voltage $V_{DC}$ at an output 21 of the VSI. Time dependent voltage that VSI 20 provides to load 80 at VSI output 21 may be represented by $V_L(t)$.

In an embodiment VSI 20 optionally comprises a pulse generator circuitry 30, a low pass pulse shaper 40, and an interruptor 50. Pulse generator circuitry 30 optionally comprises a fast switching half bridge 31 controlled by a half bridge switching controller 32. Half bridge 31 comprises fast semiconductor switches $S_1$ and $S_2$ that are controlled by switching controller 32 and are connected in series at an output 33 of the half bridge. The half bridge is connected between busbar 71, which is maintained by voltage source 70 at voltage $V_{DC}$, and reference ground 72. Switching controller 32 alternately generates ON and OFF control signals that control switches $S_1$ and $S_2$ and switch half bridge 31 between ON and OFF states, respectively. The ON control signal that turns ON half bridge 31 causes switch $S_1$ to switch ON to a conducting state and switch $S_2$ to switch OFF to a non-conducting state and thereby to connect half bridge output 33 to busbar 71. The OFF control signal that turns OFF half bridge 31 causes $S_1$ to switch to a nonconducting OFF state and switch $S_2$ to switch to a conducting ON state to connect half bridge output 33 to ground reference 72. The alternate switching of half bridge between ON and OFF states generates a sequence of voltage pulses at output 33 of the half bridge having amplitude substantially equal to voltage $V_{DC}$ at which DC voltage source 70 maintains busbar 71. Time dependent voltage generated by pulse generator circuitry 30 at output 33 may be represented by $V_B(t)$.

Low pass pulse shaper 40 optionally comprises a series inductor $L_1$ connected between half bridge output 33 and VSI output 21, and a capacitor $C_1$ in series with a resistor $R_1$ connected between VSI output 21 and ground reference 72. The pulse shaper operates to attenuate high frequency components of voltage pulses generated at half bridge output 33 and damp high frequency, large amplitude transients at the leading and trailing edges of the voltage pulses that propagate from half bridge output 33 to VSI output 21. The values for $L_1$, $C_1$, and $R_1$ are determined to moderate influence of changes in the impedance of load 80 on voltage generated at VSI output 21.

Interruptor 50 optionally comprises a Schmitt trigger 51 and a reference voltage circuit 52. Schmitt trigger 51 has noninverting and inverting inputs 54 and 55 respectively and an output 56 connected to switching controller 32. Optionally, a voltage divider 60 comprising resistors $R_2$ and $R_3$ connects VSI output 21 to inverting input 55 of the Schmitt trigger. Voltage divider 60 provides a time dependent voltage $V_C(t)=[R_3/(R_2+R_3)]V_L(t)$ to the Schmitt trigger inverting input 55.

Reference voltage circuit 52 is connected to, optionally, noninverting input 54 of the Schmitt trigger and is configured to generate a time dependent voltage reference signal, "$V_R(t)$" schematically represented in FIG. 2A by a curve 53 for each pulse of voltage $V_L(t)$ that VSI 20 generates at VSI output 21 to provide power to load 80. $V_R(t)$ is synchronized to the leading and trailing edges of the voltage pulse, optionally by synchronizing to the turn ON and turn OFF control signals that switching controller 32 generates to turn ON and turn OFF half bridge 31 and respectively initiate and terminate the voltage pulse at half bridge output 33. Optionally, reference voltage circuit 52 is connected to switching controller 32 and receives "notification" signals from switching controller 32 that the switching controller generates and are synchronized to the controller turn ON and turn OFF control signals. The reference voltage circuit uses the notification signals to synchronize $V_R(t)$ to the leading and trailing edges of the voltage pulse at output 21. Schmitt trigger 51 generates a feedback signal at a Schmitt trigger output 56 responsive to a difference between $V_C(t)$ and $V_R(t)$. The Schmitt trigger transmits the feedback signal to switching controller 32 to control voltage $V_L(t)$ provided to load 80 by the voltage pulse at VSI output 21 during rise time and fall time of the voltage pulse.

During the rise time of the voltage pulse to voltage $V_{DC}$ after switching controller 32 has turned ON half bridge 31 to initiate the pulse, $V_R(t)$ provides voltage as a function of time at input 54. $V_R(t)$ is a voltage would be expected to be substantially equal to voltage $V_C(t)$ that Schmitt trigger 51 receives at input 55 from voltage divider 60, were the slew rate of $V_L(t)$ at VSI output 21 during the rise time equal to a desired slew rate. If at a time $t_1$ during the rise time of the voltage pulse $V_L(t)$, voltage $V_C(t)$ at Schmitt trigger 51 becomes greater than $V_R(t)$ and equal to an upper hysteresis voltage threshold of Schmitt trigger 51 equal to $V_R(t_1)$ plus an upper hysteresis value of Schmitt trigger 51 at time $t_1$, time $t_1$ is a rise time turnabout time and the Schmitt trigger transmits a rise time negative feedback signal to half bridge switch controller 32. In response to the rise time negative feedback signal, controller 32 generates a turn OFF signal that turns OFF half bridge 31, disconnects VSI output 21 and thereby load 80 from busbar 71, and connects the output and load to ground reference 72 to allow voltage $V_L(t)$ to decay. In accordance with an embodiment, voltage $V_L(t)$ decreases thereafter until a subsequent rise time turnabout time $t_2$ at which time $V_C(t)$ becomes equal to a lower hysteresis threshold voltage of Schmitt trigger 51, which is equal to $V_R(t_2)$ minus a lower hysteresis value of Schmitt trigger 51 at time $t_2$. At the rise time turnabout time the Schmitt trigger generates a rise time negative feedback signal at output 56 that causes switching controller 32 to turn ON half bridge 31 and reconnect VSI output 21 to busbar 71 to enable voltage $V_L(t)$ at VSI output 21 resume increasing towards DC voltage $V_{DC}$. In accordance with an embodiment of the disclosure, interruptor 50 repeats the "interruption cycle" of turning OFF and subsequently turning ON half bridge 31 each time voltage $V_C(t)$ rises to equal the upper hysteresis threshold voltage of Schmitt trigger 51 and subsequently falls to equal the lower hysteresis threshold voltage of the Schmitt trigger during the rise time of the voltage pulse to moderate an average rise time slew rate of the pulse.

Similarly, during the fall time of the voltage pulse, after switching controller 32 has turned OFF half bridge 31 to terminate the pulse of voltage $V_L(t)$ at output 21, reference signal $V_R(t)$ provides voltage as a function of time at input 54 that would be expected to be substantially equal to voltage $V_C(t)$ at Schmitt trigger input 55, were the slew rate of voltage $V_L(t)$ at VSI output 21 during the fall time equal a desired slew rate. If at a time $t_1$ during the fall time, $V_C(t)$ decreases to a lower hysteresis threshold voltage of Schmitt trigger 51, $t_1$ is a turnabout time and the Schmitt trigger 51 generates and transmits a fall time negative feedback signal to half bridge switch controller 32. In response to the negative feedback signal, controller 32 generates a turn ON signal that turns ON half bridge 31, disconnects VSI output 33 and thereby load 80 from ground reference 72, and connects the VSI output and load 80 to busbar 71 to cause voltage $V_L(t)$ to increase. In accordance with an embodiment, voltage $V_L(t)$ increases until a subsequent fall time turnabout time $t_2$ at which time $V_C(t)$ exceeds $V_R(t)$ and is equal to an upper hysteresis threshold voltage of Schmitt trigger 51. Responsive to $V_C(t)$ equaling the upper hysteresis threshold voltage, Schmitt trigger 51 generates a fall time negative feedback signal at output 56 that causes switching controller 32 to turn OFF half bridge 31 and reconnect VSI output 21 to reference ground 72 to enable voltage $V_L(t)$ to continue decreasing to reference ground 72. In accordance with an embodiment of the disclosure interruptor 50 repeats the interruption cycle of turning ON and subsequently turning OFF half bridge 31 each time voltage $V_C(t)$ respectively equals the lower and upper hysteresis threshold voltages of Schmitt trigger 51 during the fall time of the voltage pulse to moderate an average of the fall time slew rate of the voltage pulse.

Figure 2B:
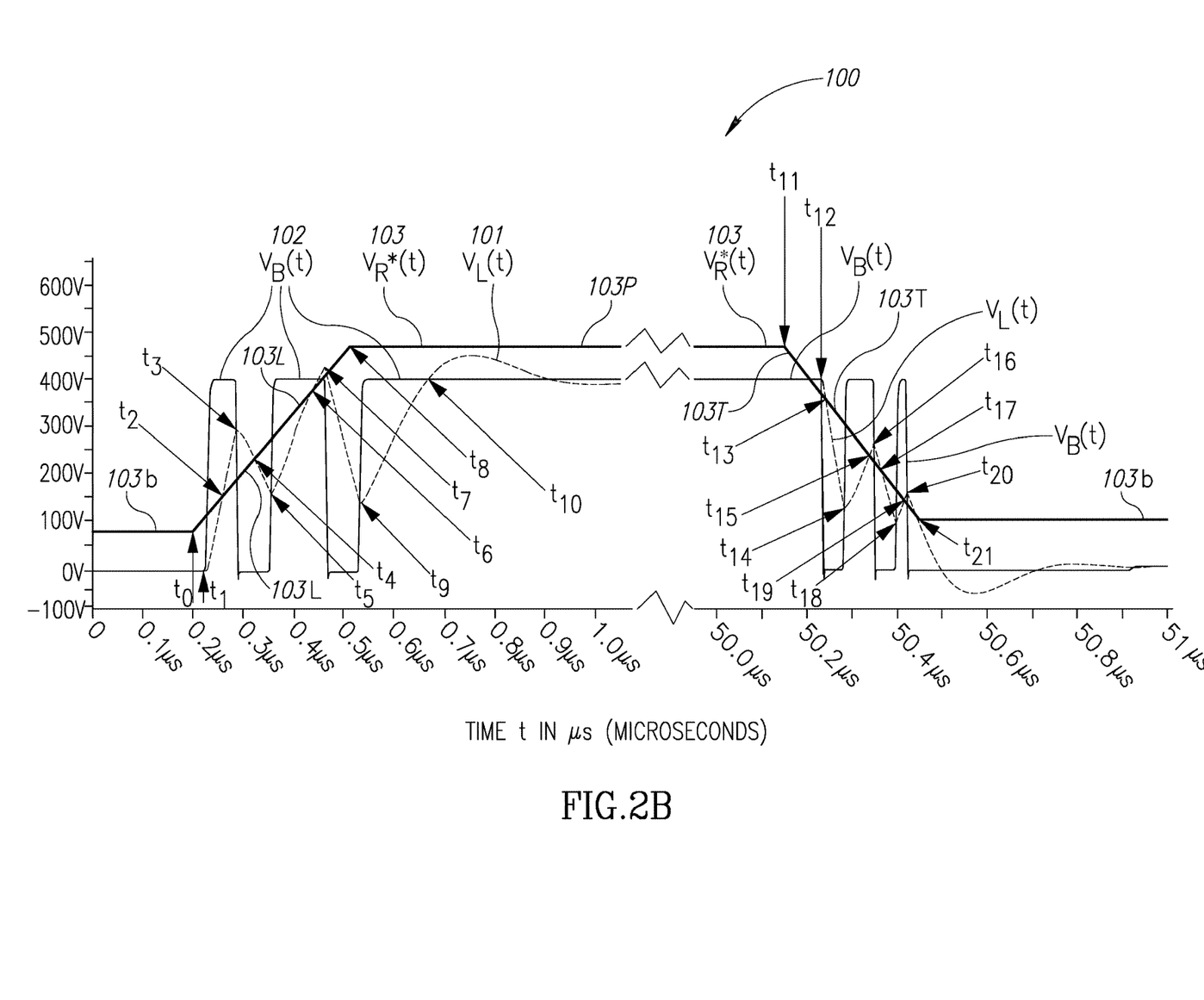
FIG. 2B schematically shows simulated oscilloscope traces that illustrate operation of the VSI shown in FIG. 2A in controlling rise time and fall time slew rates of a voltage pulse that the VSI provides.

FIG. 2B shows a graph 100 of simulated oscilloscope traces 101, 102, and 103. The traces graph voltages as a functions of time that illustrate operation of a VSI similar to VSI 20 in controlling average rise time and fall time slew rates of a voltage pulse that the VSI provides at output 21 in accordance with an embodiment of the disclosure. Voltage is shown along the ordinate of graph 100 graduated in volts, V, and time is shown along an abscissa of the graph graduated in microseconds (μs). Features of the traces relevant to the discussion are indicated by arrows pointing to the features labeled by times at which they occur.

Trace 101, also labeled $V_L(t)$, graphs voltage $V_L(t)$ of the generated pulse that the VSI provides at output 21 as a function of time. Trace 102, also labeled $V_B(t)$, graphs voltage $V_B(t)$ as a function of time at output 33 of half bridge 31, which controller 32 controls to generate voltage $V_B(t)$ responsive to feedback signals generated by interruptor 50. Trace 103 also labeled $V_R^*(t)$ graphs a time dependent virtual reference voltage $V_R^*(t)$. $V_R^*(t)$ is a voltage at output 21 that would produce reference voltage $V_R(t)$ at input 55 of Schmitt trigger 51. For VSI 20, virtual reference voltage $V_R^*(t)=[(R_2+R_3)/R_3]V_R(t)$. When $V_R^*(t)$ is greater than or less than $V_L(t)$ voltage $V_R(t)$ is greater than or less than $V_C(t)$. For convenience of presentation, $V_L(t)$ and $V_R^*(t)$, may be used in place of corresponding voltages $V_C(t)$ and $V_R(t)$ to describe operation of VSI 20 and turnabout times at which Schmitt trigger 51 generates negative feedback signals to control slew rates of $V_L(t)$.

In an embodiment, reference voltage $V_R(t)$ is configured as a function of time having, optionally, a trapezoidal shape and a corresponding trapezoidal virtual reference voltage $V_R^*(t)$ that is illustrated in FIG. 2B by trace 103. $V_R^*(t)$ rises from an offset bias voltage 103b to a voltage plateau 103P along an optionally linear leading edge 103L and falls along an optionally linear trailing edge 103T from the plateau to optionally the same bias. It is noted that whereas reference voltage circuit 52 generates $V_R(t)$, but not $V_R^*(t)$, which as noted above is virtual and derived from $V_R(t)$, for convenience of exposition reference voltage circuit 52 may be described as generating or producing virtual reference voltage $V_R^*(t)$.

By way of example, the simulated traces shown in graph 100 assume that voltage source 70 provides a voltage $V_{DC}$ at busbar 71 equal to 400V relative to a voltage 0V at reference ground 72 and that the VSI is operating to provide a voltage pulse of magnitude 400V and pulse length of about 50 milliseconds to a load 80 optionally a phase of an induction motor. The motor phase is assumed to present an inductance LM=100 uH and resistance LR=3Ω (Ohms) to VSI 20. Switches $S_1$ and $S_2$ (FIG. 2A) are assumed to fast switching semiconductor switches that switching controller 32 (FIG. 2A) controls to switch output 33 between ON and OFF to provide changes in voltage $V_B(t)$ at output 33 (FIG. 2A) at slew rates of about 60V/ns (nanoseconds). Inductor $L_1$, capacitor $C_1$, and resistor $R_1$ of pulse shaper 40 have values 200 nH and 15 nF and 4Ω respectively. Resistors $R_2$ and $R_3$ of voltage divider 60 have values 100 kΩ and 1 kΩ respectively. Schmitt trigger 51 of interruptor 50 is an operational amplifier having an output rise time of about 10 ns. Offset voltage 103b is equal to about 75V, voltage of plateau 103P is equal to about 475V and slew rates for both leading and trailing edges 103L and 105T are constant at about 1.5V/ns.

In an embodiment, as shown by trace 103 in FIG. 2B reference voltage circuit 52 (FIG. 2A) initiates voltage $V_R^*(t)$ at an arbitrary time $t_o$=0.2 μs, optionally in response to a notification signal received from switching controller 32. Shortly thereafter switching controller 32 (FIG. 2A) turns ON half bridge 31 and at a time $t_1$ initiates provision of voltage $V_B(t_1)$ at output 33 of half bridge 31, which increases towards $V_{DC}$ of 400V at a large slew rate of about 60V/ns. In response to initiation and increase of $V_B(t)$, voltage $V_L(t)$ at output 21 of VSI 20 imaged by trace 101 begins to increase at a relatively large slew rate of about 3.5 V/ns. The slew rate of $V_L(t)$ is substantially greater than the desired slew rate of about 1.5 V/ns that characterizes $V_R^*(t)$, and at a time $t_2$, as indicated by an arrow labeled by $t_2$, $V_L(t)$ exceeds $V_R^*(t)$ and correspondingly $V_C(t)$ at inverting input 55 of Schmitt trigger 51 exceeds $V_R(t)$. Thereafter $V_L(t)$ and $V_C(t)$ continue to increase until at a rise time turnabout time $t_3$ $V_L(t)$ exceeds $V_R^*(t)$ by an amount which causes $V_C(t)$ to reach an upper hysteresis voltage threshold of Schmitt trigger 51. In response to $V_C(t)$ reaching the upper hysteresis voltage threshold at rise time turnabout time $t_3$, Schmitt trigger 51 generates and inputs a rise time negative feedback signal to switching controller 32. In response, switching controller 32 turns OFF half bridge 31 at rise time turnabout time $t_3$ causing voltage $V_B(t)$ at output 33 of the half bridge to rapidly decrease at a slew rate of about −60V/ns to reference ground 0 and as a result voltage $V_L(t)$ at output 21 to decay. At a subsequent time $t_4$ $V_L(t)$ decreases to below $V_R^*(t)$ and at about a rise time turnabout time $t_5$ $V_C(t)$ reaches a lower hysteresis voltage threshold of Schmitt trigger 51—that is, $V_C(t)$ reaches a lower hysteresis voltage threshold of the Schmitt trigger relative to $V_R(t)$. Responsive to $V_C(t)$ reaching the lower hysteresis voltage threshold the Schmitt trigger inputs a negative feedback signal to switching controller 32. The feedback signal causes the switching controller at rise time turnabout time $t_5$ to turn ON half bridge 31 and voltage $V_B(t)$ to rapidly increase and output voltage $V_L(t)$ to resume increasing towards $V_{DC}$.

At a time $t_6$ $V_L(t)$ again exceeds $V_R^*(t)$ and at about a rise time turnabout time $t_7$ reaches an upper hysteresis voltage threshold at which turnabout time $t_7$ Schmitt trigger 51 generates a negative feedback signal that turns OFF half bridge 31. causing $V_L(t)$ to decrease until it reaches a lower hysteresis voltage threshold at about a rise time turnabout time $t_9$. At rise time turnabout time $t_9$ the Schmitt trigger generates a negative feedback signal that again turns ON half bridge 31 to cause $V_L(t)$ to resume increasing to voltage $V_{DC}$. It is noted that at a time $t_8$ prior to $t_9$ and about 0.3 μs after time $t_o$, $V_R^*(t)$ has reached plateau 103P at a voltage greater than $V_{DC}$. As a result $V_L(t)$ no longer exceeds $V_R^*(t)$, Schmitt trigger 51 ceases to generate rise time negative feedback signals and after a time $t_{10}$ $V_L(t)$ converges to a relatively stable voltage $V_{DC}$. As a result of the operation of interruptor 50 $V_L(t)$ rises from about 0 V to about 400 V in about 0.4 μs for a rise time slew rate of about 1 V/ns, which is equal to about 1/60 of the rise time slew rate of $V_B(t)$.

In the example shown in graph 100 VSI 20 is assumed to be operating to generate a voltage pulse at output 21 have a pulse width of about 3000 μs and at a time $t_{11}$ reference voltage generator 52 initiates a linear decrease of voltage $V_R^*(t)$ along trailing edge 103T to offset bias voltage 103b at a time $t_{21}$. Shortly thereafter at time $t_{12}$ switching controller 32 turns OFF half bridge 31 causing $V_B(t)$ to "plummet" and $V_L(t)$ to decrease rapidly at a slew rate substantially less than that of trailing edge 103T. At a time $t_{13}$ $V_L(t)$ decreases to below $V_R^*(t)$ and at a fall time turnabout time $t_{14}$ reaches a fall time lower hysteresis voltage threshold of Schmitt trigger 51 causing the Schmitt trigger to generate a fall time negative feedback signal that turns ON half bridge 31, interrupts the decrease of $V_L(t)$, and causes $V_L(t)$, to rise to an upper hysteresis voltage threshold of Schmitt trigger

51 at about a fall time turnabout time $t_{16}$. At turnabout time $t_{16}$ the Schmitt trigger generates a fall time negative feedback signal that turns OFF the half bridge to allow $V_L(t)$ to resume decreasing to 0 V. $V_L(t)$ goes through one more cycle of turning ON and turning OFF of half bridge 31, and at a time $t_{21}$ falls below offset bias voltage 103b and thereafter converges to 0V.

As a result of the operation of interruptor 50 $V_L(t)$ falls from about 400 V to about 0 V in about 0.4 µs for a fall time slew rate of about 1 V/ns, which is again equal to about ¹⁄₆₀ of the fall time slew rate of $V_B(t)$.

Figure 3:
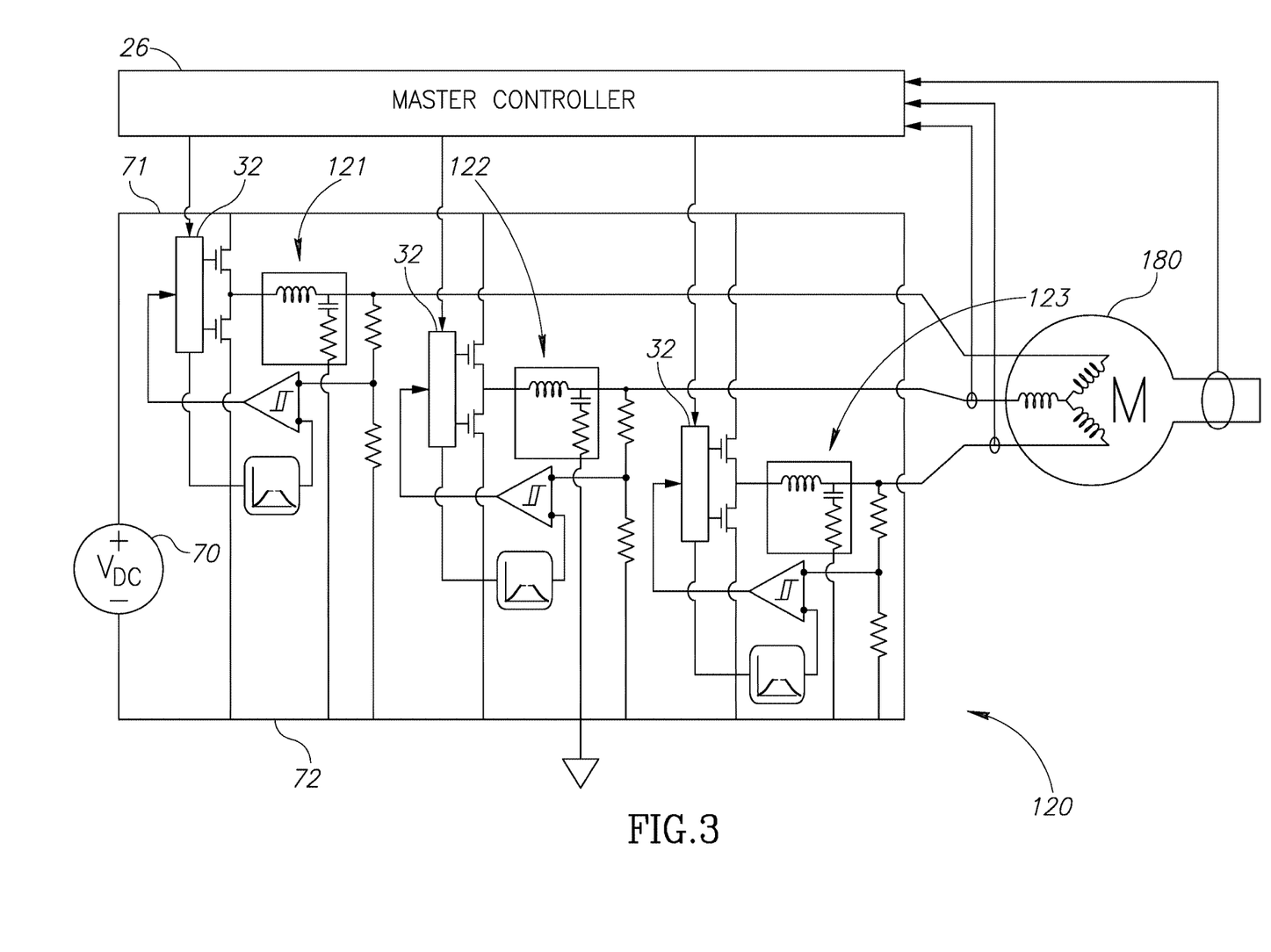
FIG. 3 schematically shows a VSI configured to provide voltage pulse trains to a three phase motor in accordance with an embodiment of the disclosure.

Whereas a VPG or VIS in accordance with an embodiment of the disclosure may be used to provide power for various different devices and applications, a plurality VISs similar to VIS 20 may be used to power an electric motor. By way of example, FIG. 3 schematically shows VIS 120 comprising VISs 121, 122, and 123 similar to VIS 20 shown in FIG. 2A and configured to power a three phase induction motor 180 that may optionally be used to power an automotive vehicle. A master controller 26 synchronizes VISs 121, 122, and 123 so that voltages provided by the VISs are phase shifted by ±120° from each other. Optionally as schematically shown in the figure VIS 120 is connected to motor in a star configuration.

There is therefore provided in accordance with an embodiment of the disclosure a voltage pulse generator (VPG) having an output at which the VPG provides power to a load, the VPG comprising: pulse circuitry operable to be turned ON and OFF respectively to provide and to terminate voltage at an output of the pulse circuitry to provide a pulse of voltage having leading and trailing transition edges at the output of the VPG; and an interruptor configured to monitor voltage at the VPG output during a transition edge of the voltage pulse at the VPG output and interrupt a change in voltage of the transition edge if the monitored voltage is greater than or less than a predetermined time dependent reference voltage by a predetermined upper or lower limit difference voltage respectively. Optionally, the pulse circuitry comprises a half bridge comprising two semiconductor switches connected in series at the output of the pulse circuitry.

Additionally or alternatively the interruptor may comprise a hysteretic comparator circuit characterized by upper and lower hysteresis values and wherein the predetermined upper and lower limit difference voltages are functions of the upper and lower hysteresis values respectively. Optionally, the hysteretic comparator circuit comprises a Schmitt trigger. Additionally or alternatively the hysteretic comparator circuit may comprise a first input connected to the VPG output to receive a first voltage that is a function of the voltage at the output, a second input that receives a second voltage that is a function of the time dependent reference voltage, and an output at which the hysteretic comparator circuit generates a feedback signal that interrupts the voltage change of the at least one transition edge responsive to a difference between the first and second voltages. Optionally the VPG comprises a voltage divider connected to the VPG output that provides the first input with a fraction less than one of the voltage at the VPG output. Additionally or alternatively the first input may be connected to the VPG output by a voltage divider that provides the first input with a fraction less than one of the voltage at the VPG output.

In an embodiment the time dependent reference voltage comprises a reference voltage pulse having at least one transition edge synchronized to a transition edge of the voltage pulse at the VPG output. Optionally, the at least one transition edge of the reference voltage pulse comprises a leading edge synchronized to the leading edge of the VPG output pulse and a trailing edge synchronized to the trailing edge of the VPG output pulse. Optionally the leading edge is characterized by a rise time less than or equal to about 0.5 µs (microseconds) 0.4 µs, or 0.3 µs. Additionally or alternatively the trailing edge may be characterized by a fall time less than or equal to about 0.5 µs (microseconds) 0.4 µs, or 0.3 µs.

In an embodiment the reference voltage pulse comprises a voltage plateau having a magnitude that is greater than a maximum voltage of the first voltage by the smaller of the upper or lower limit difference voltage.

In an embodiment the reference voltage pulse is biased by an offset voltage that differs from a reference ground of the VPG by a voltage difference having a magnitude that is less than the smaller of the predetermined upper and lower limit difference voltages.

In an embodiment the VPG comprises a reference voltage generator that provides the second voltage to the hysteretic comparator circuit.

In an embodiment, for a positive pulse at the VPG output if the monitored voltage at the VPG output is greater than the reference voltage by the predetermined upper limit voltage difference and the pulse circuitry is ON, the feedback signal turns OFF the pulse circuitry and if the output voltage is less than the reference voltage by the predetermined lower limit voltage difference and the pulse circuitry is OFF, the feedback signal turns ON the pulse circuitry.

In an embodiment, for a negative pulse at the VPG output, if the reference voltage is greater than the VPG output voltage by the predetermined upper limit voltage difference and the pulse circuitry is ON, the feedback signal turns OFF the pulse circuitry and if the reference voltage is less than the output voltage by the predetermined lower limit voltage difference and the pulse circuitry is OFF, the feedback signal turns ON the pulse circuitry.

In an embodiment, a magnitude of an average slew rate of the transition edge of the output pulse responsive to the interruption is less than about 20%, 10%, or about 5% of a magnitude of a maximum slew rate that characterizes a leading or trailing edge of voltage provided by the pulse circuitry when the pulse circuitry is respectively turned ON or turned OFF.

Optionally, the magnitude of the average slew rate is less than about 3% of the magnitude of the maximum slew rate. Additionally or alternatively, the magnitude maximum of the slew rate that characterizes the leading or trailing edge of voltage provided by the pulse circuitry is optionally greater than about 20 V/ns, 50 V/ns (nanoseconds), or about 60 V/ns.

In an embodiment, the VPG comprises a voltage source inverter (VSI) wherein the output of the VPG is an output of the VSI.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:

1. A voltage pulse generator (VPG) having an output at which the VPG provides power to a load, the VPG comprising:
pulse circuitry operable to be turned ON and OFF respectively to provide and to terminate voltage at an output of the pulse circuitry to provide a pulse of voltage having leading and trailing transition edges at the output of the VPG; and
an interruptor comprising a hysteretic comparator circuit characterized by upper and lower hysteresis values and having a first input connected to the VPG output to receive a first voltage that is a function of the voltage at the output, a second input that receives a second voltage having magnitude equal to a predetermined time dependent reference voltage that is independent of voltage at the output of the VPG and the comparator, and an output at which the hysteretic comparator circuit generates a feedback signal that interrupts voltage change of at least one transition edge of the pulse if the first voltage is greater than or less than the second voltage by predetermined upper or lower limit difference voltages respectively, which upper and lower limit difference voltages are functions of the upper and lower hysteresis values respectively;
wherein the reference voltage comprises a reference voltage pulse having a leading edge synchronized to the leading edge of the VPG output pulse and a trailing edge synchronized to the trailing edge of the VPG output pulse.

2. The VPG according to claim 1 wherein the pulse circuitry comprises a half bridge comprising two semiconductor switches connected in series at the output of the pulse circuitry.

3. The VPG according to claim 1 wherein the hysteretic comparator circuit comprises a Schmitt trigger.

4. The VPG according to claim 1 and comprising a voltage divider connected to the VPG output that provides the first input with a fraction less than one of the voltage at the VPG output.

5. The VPG according to claim 4 wherein the first input is connected to the VPG output by a voltage divider that provides the first input with a fraction less than one of the voltage at the VPG output.

6. The VPG according to claim 1 wherein the leading edge is characterized by a rise time less than or equal to about 0.5 μs (microseconds) 0.4 μs, or 0.3 μs.

7. The VPG according to claim 6 wherein the trailing edge is characterized by a fall time less than or equal to about 0.5 μs (microseconds) 0.4 μs, or 0.3 μs.

8. The VPG according to claim 1 wherein the reference voltage pulse comprises a voltage plateau having a magnitude that is greater than a maximum voltage of the first voltage by the smaller of the upper or lower limit difference voltage.

9. The VPG according to claim 1 wherein the reference voltage pulse is biased by an offset voltage that differs from a reference ground of the VPG by a voltage difference having a magnitude that is less than the smaller of the predetermined upper and lower limit difference voltages.

10. The VPG according to a claim 1 and comprising a reference voltage generator that provides the second voltage to the hysteretic comparator circuit.

11. The VPG according to claim 1 wherein for a positive pulse at the VPG output if the voltage at the VPG output is greater than the reference voltage by the predetermined upper limit voltage difference and the pulse circuitry is ON, the feedback signal turns OFF the pulse circuitry and if the output voltage is less than the reference voltage by the predetermined lower limit voltage difference and the pulse circuitry is OFF, the feedback signal turns ON the pulse circuitry.

12. The VPG according to claim 1 wherein for a negative pulse at the VPG output if the reference voltage is greater than the VPG output voltage by the predetermined upper limit voltage difference and the pulse circuitry is ON, the feedback signal turns OFF the pulse circuitry and if the reference voltage is less than the output voltage by the predetermined lower limit voltage difference and the pulse circuitry is OFF, the feedback signal turns ON the pulse circuitry.

13. The VPG according to claim 1 wherein a magnitude of an average slew rate of the transition edge of the output pulse responsive to the interruption is less than about 20%, 10%, or about 5% of a magnitude of a maximum slew rate that characterizes a leading or trailing edge of voltage provided by the pulse circuitry when the pulse circuitry is respectively turned ON or turned OFF.

14. The VPG according to claim 13 wherein the magnitude of the average slew rate is less than about 3% of the magnitude of the maximum slew rate.

15. The VPG according to claim 13 wherein the magnitude maximum of the slew rate that characterizes the leading or trailing edge of voltage provided by the pulse circuitry is greater than about 20 V/ns, 50 V/ns (nanoseconds), or about 60 V/ns.

16. The VPG according to claim 1 and comprising a voltage source inverter (VSI) wherein the output of the VPG is an output of the VSI.

* * * * *